（12）United States Patent
Kobayashi et al.

(10) Patent No.: US 10,896,922 B2
(45) Date of Patent: Jan. 19, 2021

(54) IMAGING APPARATUS, IMAGING SYSTEM, MOVING OBJECT, AND METHOD FOR MANUFACTURING IMAGING APPARATUS

(71) Applicant: CANON KABUSHIKI KAISHA, Tokyo (JP)

(72) Inventors: Masahiro Kobayashi, Tokyo (JP); Hiroshi Sekine, Kawagoe (JP); Yusuke Onuki, Fujisawa (JP); Toru Koizumi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 243 days.

(21) Appl. No.: 15/996,313

(22) Filed: Jun. 1, 2018

(65) Prior Publication Data

US 2018/0366499 A1 Dec. 20, 2018

(30) Foreign Application Priority Data

Jun. 20, 2017 (JP) ................................. 2017-120765

(51) Int. Cl.
| | | |
|---|---|---|
| *H01L 27/146* | (2006.01) | |
| *H01L 21/265* | (2006.01) | |
| *H01L 21/266* | (2006.01) | |
| *H04N 5/353* | (2011.01) | |
| *H04N 5/232* | (2006.01) | |
| *H04N 5/3745* | (2011.01) | |

(Continued)

(52) U.S. Cl.
CPC ........ *H01L 27/1461* (2013.01); *H01L 21/266* (2013.01); *H01L 21/26513* (2013.01); *H01L 27/14643* (2013.01); *H01L 27/14689* (2013.01); *H04N 5/232* (2013.01); *H04N 5/23229* (2013.01); *H04N 5/353* (2013.01); *H04N 5/37452* (2013.01); *G06K 9/00791* (2013.01); *G06T 7/593* (2017.01); *G06T 2207/10012* (2013.01); *H01L 21/74* (2013.01)

(58) Field of Classification Search
None
See application file for complete search history.

(56) References Cited

U.S. PATENT DOCUMENTS 9,130,071 B2 * 9/2015 Suzuki ............. H01L 31/02325
9,716,849 B2 * 7/2017 Kobayashi ........ H01L 27/14623

FOREIGN PATENT DOCUMENTS

| JP | 2008-511176 A | 4/2008 |
|---|---|---|
| WO | 2011/043432 A1 | 4/2011 |

* cited by examiner

*Primary Examiner* — Bradley Smith
(74) *Attorney, Agent, or Firm* — Canon U.S.A., Inc. IP Division

(57) ABSTRACT

An imaging apparatus includes a photoelectric conversion unit of a first conductivity type, a charge holding unit of the first conductivity type, the charge holding unit being configured to hold electric charges transferred from the photoelectric conversion unit, a floating diffusion unit of the first conductivity type, the floating diffusion unit being configured to receive electric charges transferred from the charge holding unit, a punch-through prevention layer of a second conductivity type, the punch-through prevention layer being disposed between the charge holding unit and the floating diffusion unit to contact the floating diffusion unit, and a transfer assistance layer of the first conductivity type, the transfer assistance layer being disposed between the punch-through prevention layer and a surface of a semiconductor substrate.

10 Claims, 13 Drawing Sheets

(51) Int. Cl.
*H01L 21/74* (2006.01)
*G06T 7/593* (2017.01)
*G06K 9/00* (2006.01)

FIG.10
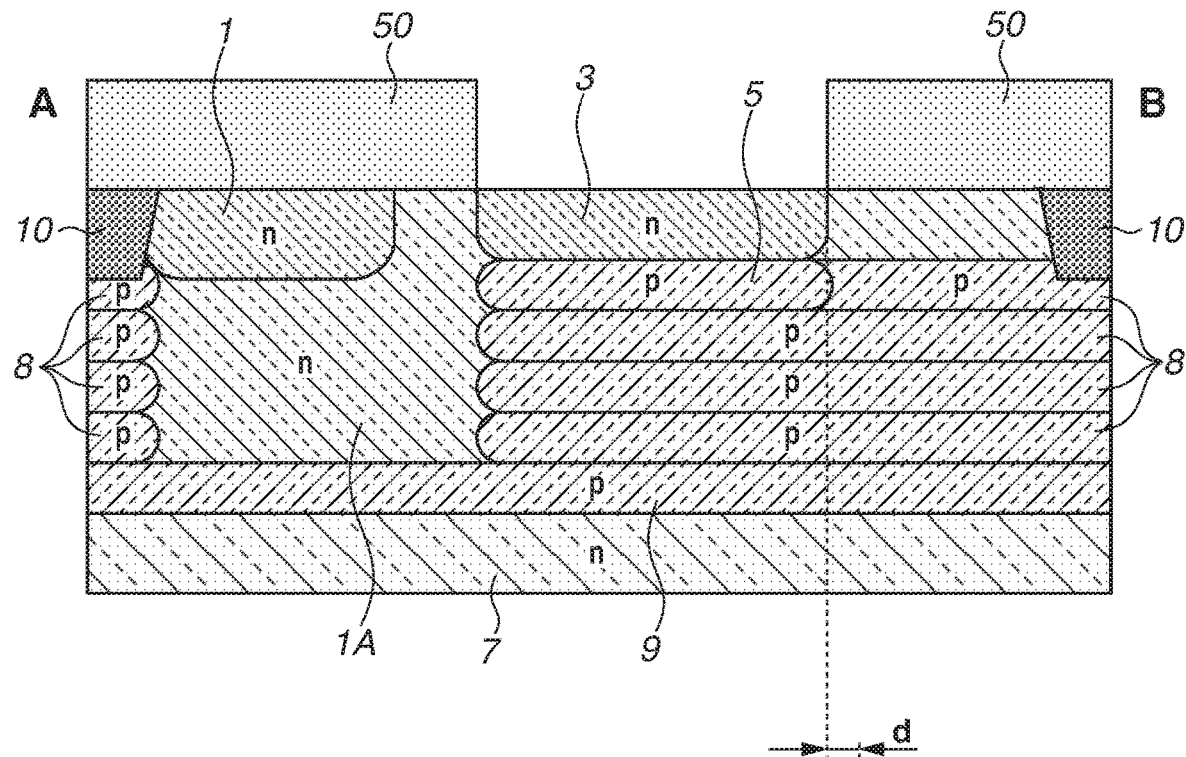
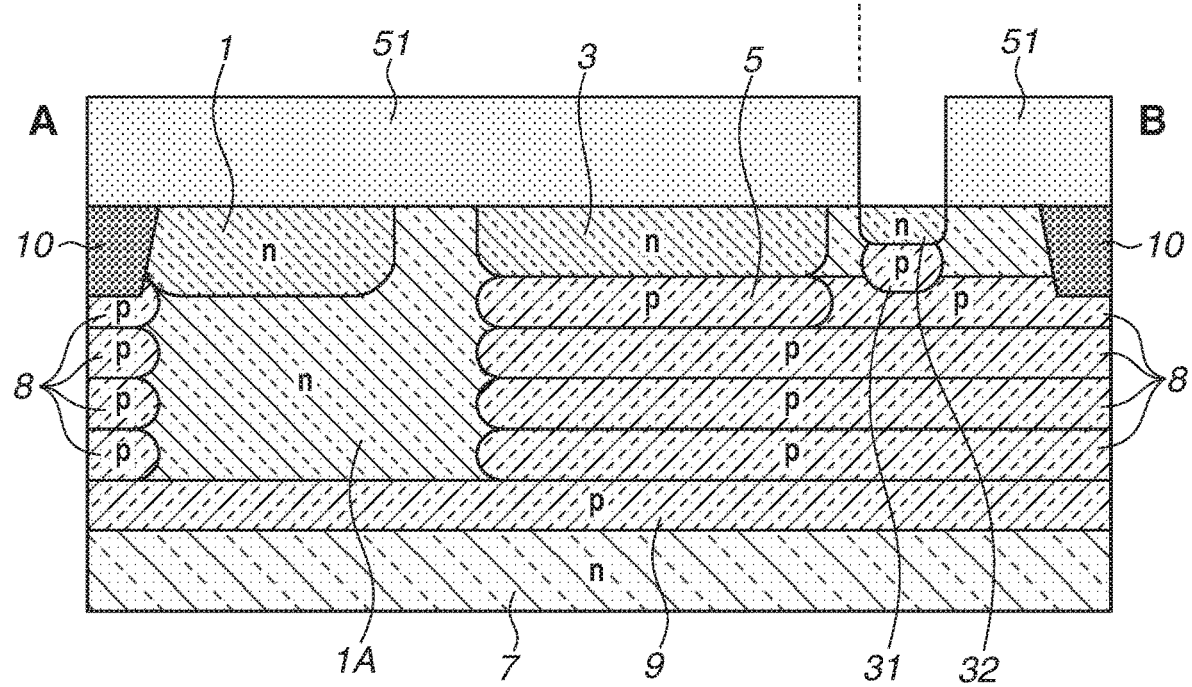

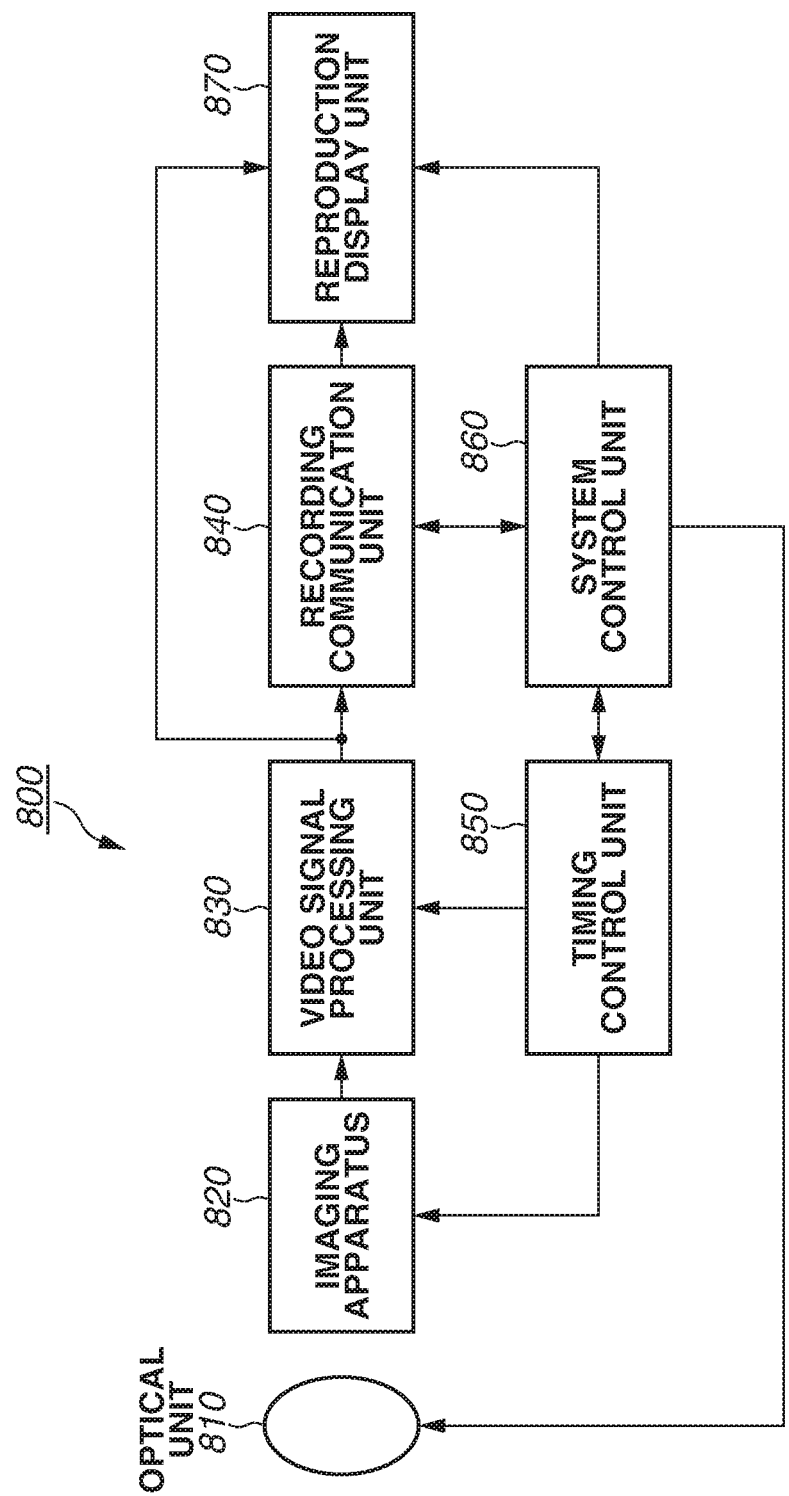

IMAGING APPARATUS, IMAGING SYSTEM, MOVING OBJECT, AND METHOD FOR MANUFACTURING IMAGING APPARATUS

BACKGROUND OF THE INVENTION

Field of the Invention

The aspect of the embodiments relates to an imaging apparatus, an imaging system, a moving object, and a method for manufacturing an imaging apparatus.

Description of the Related Art

WO2011/043432 and Japanese Unexamined Patent Application Publication (Translation of PCT Application) No. 2008-511176 each discuss an imaging apparatus including a plurality of pixels. The pixels each include a photoelectric conversion unit, a charge holding unit for receiving electric charges transferred from the photoelectric conversion unit, and a floating diffusion unit for receiving electric charges transferred from the charge holding unit. This imaging apparatus can implement shutter operation for accumulating electric charges for all the pixels simultaneously. This operation is referred to as global electronic shutter operation.

SUMMARY OF THE INVENTION

A method according to an exemplary embodiment is a method for manufacturing an imaging apparatus including a photoelectric conversion unit of a first conductivity type, a charge holding unit of the first conductivity type, the charge holding unit being configured to hold electric charges transferred from the photoelectric conversion unit, a floating diffusion unit of the first conductivity type, the floating diffusion unit being configured to receive electric charges transferred from the charge holding unit, and a punch-through prevention layer of a second conductivity type, the punch-through prevention layer being disposed between the charge holding unit and the floating diffusion unit to contact the floating diffusion unit. The method includes forming the punch-through prevention layer by implanting a first impurity into a semiconductor substrate with first implantation energy, with use of a first mask having a first opening, and implanting a second impurity corresponding to a conductivity type different from a conductivity type of the first impurity into the semiconductor substrate with second implantation energy lower than the first implantation energy, with use of the first mask.

An imaging apparatus according to another exemplary embodiment includes a photoelectric conversion unit of a first conductivity type, a charge holding unit of the first conductivity type, the charge holding unit being configured to hold electric charges transferred from the photoelectric conversion unit, a floating diffusion unit of the first conductivity type, the floating diffusion unit being configured to receive electric charges transferred from the charge holding unit, a punch-through prevention layer of a second conductivity type, the punch-through prevention layer being disposed between the charge holding unit and the floating diffusion unit to contact the floating diffusion unit, and a transfer assistance layer of the first conductivity type, the transfer assistance layer being disposed between the punch-through prevention layer and a surface of a semiconductor substrate.

Further features of the disclosure will become apparent from the following description of exemplary embodiments with reference to the attached drawings.

BRIEF DESCRIPTION OF THE DRAWINGS

FIG. 10 is a process flow diagram illustrating a method for forming an imaging apparatus.

FIG. 11 is a block diagram of an imaging system.

DESCRIPTION OF THE EMBODIMENTS

Exemplary embodiments of the disclosure will be described in detail below. The exemplary embodiments described below each illustrate an aspect of the disclosure by an example. However, the disclosure is not limited to the following exemplary embodiments. According to some of the exemplary embodiments, image quality can be improved.

Figure 2:
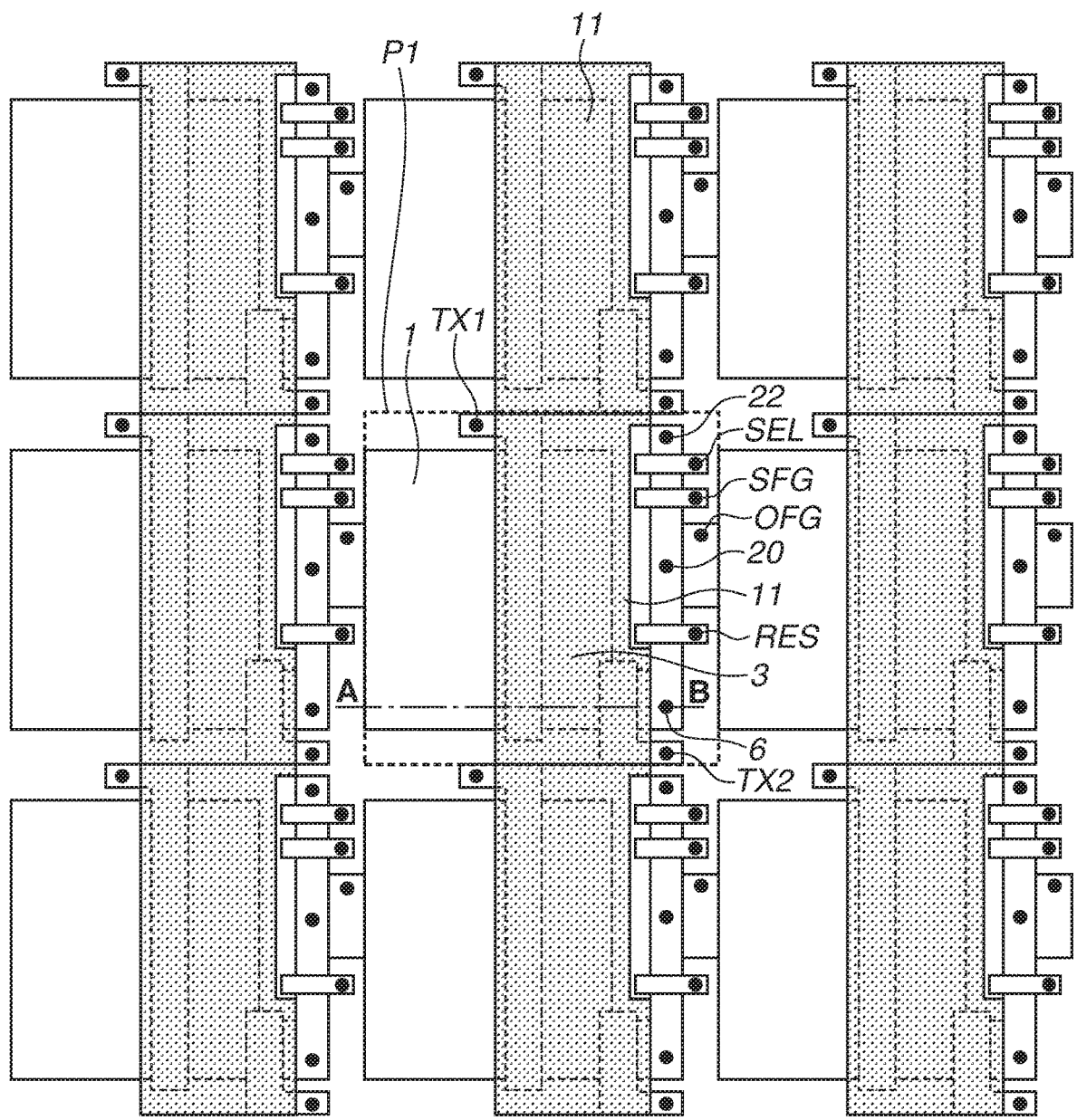
FIG. 2 is a diagram schematically illustrating a plane structure of a pixel in an imaging apparatus.

WO2011/043432 (hereinafter referred to as "patent document 1") discusses a structure for transfer an electric charge from a photoelectric conversion unit to a charge holding unit. However, the patent document 1 does not discuss a structure for transfer the charge from the charge holding unit to a floating diffusion unit, and noise such as dark current generated in the apparatus. For example, as illustrated in FIG. 2 of the patent document 1, the charge holding unit and the floating diffusion unit are connected through a capacitor formation region 25. Therefore, punch-through tends to occur between the charge holding unit and the floating diffusion unit. As a result, it is difficult to increase the saturation charge quantity of a pixel. A block layer 27 is provided below the capacitor formation region 25. However, because the distance therebetween is large, it is difficult to prevent punch-through at the block layer 27 of the patent document 1.

Japanese Unexamined Patent Application Publication (Translation of PCT Application) No. 2008-511176 (hereinafter referred to as "patent document 2") discusses a p-type dope region 152 provided between a charge holding unit and a floating diffusion unit. The p-type dope region 152 forms a barrier to electric charges. As illustrated in FIG. 2B of the patent document 2, the p-type dope region 152 is formed near a joint interface of a semiconductor substrate. Therefore, there is a possibility that electric-charge transfer efficiency may decrease when electric charges are transferred from the charge holding unit to the floating diffusion unit. For example, it may take a long time to transfer electric charges due to an insufficient decrease in the potential of a transfer channel. In that case, the electric charges are more likely to be recombined during the transfer. Alternatively, there is a possibility that electric charges remaining in the transfer channel may return to the charge holding unit when a transfer transistor is turned off. As a result, in an imaging apparatus discussed in the patent document 2, image quality may deteriorate, which may be an issue.

A first exemplary embodiment of the disclosure will be described with reference to FIGS. 1 to 4. Similar members are provided with the same numerals in FIGS. 1 to 4. The following exemplary embodiment will be described using a case where electrons are signal charges. However, holes may be signal charges, and in such a case, the conductivity type of each unit becomes opposite.

Figure 1:
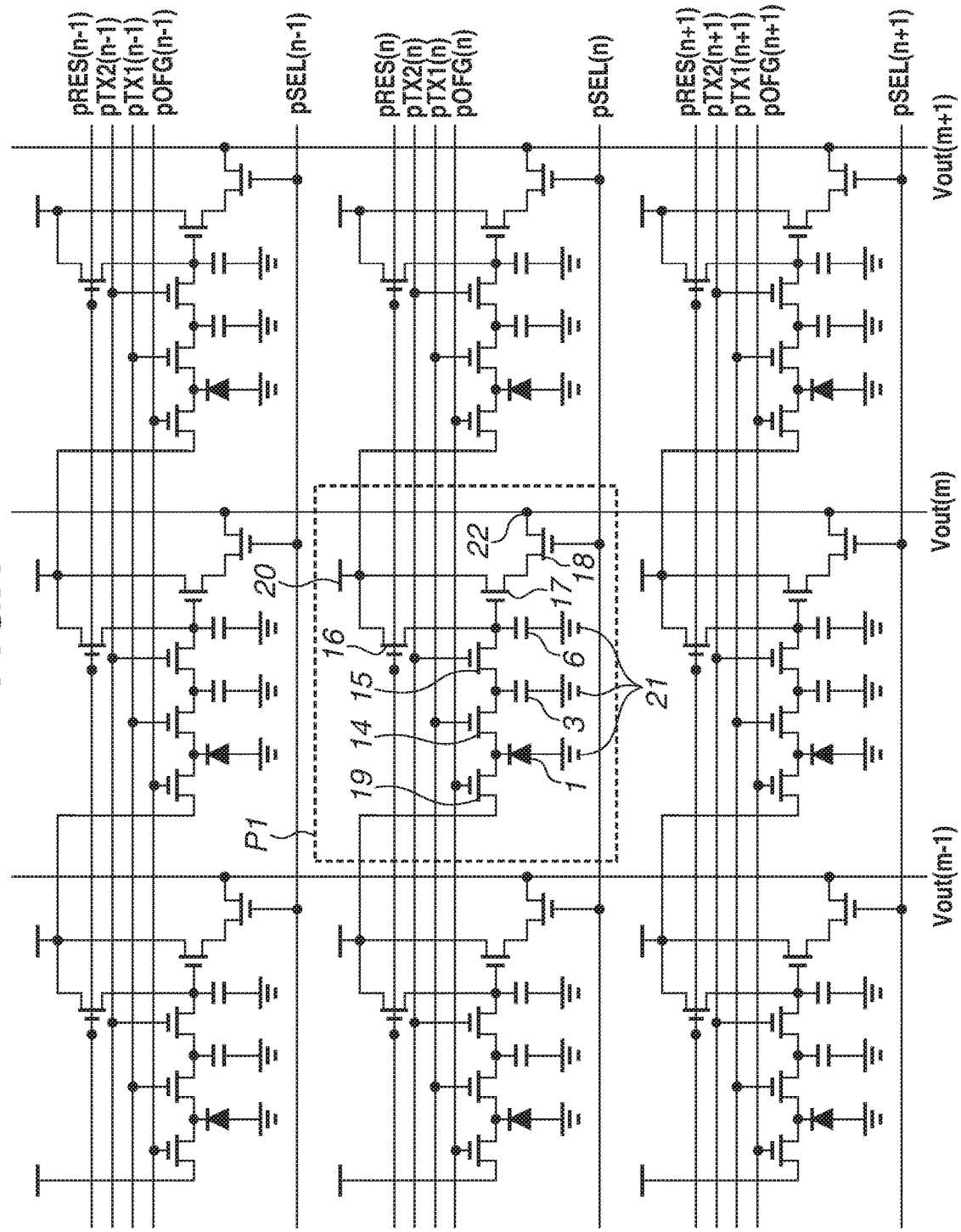
FIG. 1 is a diagram illustrating an equivalent circuit of a pixel in an imaging apparatus.

FIG. 1 is a diagram illustrating a circuit arrangement of a pixel P1 according to the first exemplary embodiment. The pixel P1 is an element for converting incident light into an electric signal. A pixel array is formed by arranging a plurality of pixels P1 in a matrix. FIG. 1 illustrates an equivalent circuit of the pixels P1 in three rows and three columns. The pixel P1 is formed on a semiconductor substrate made of a material such as silicon (Si).

The pixel P1 includes a photoelectric conversion unit 1, a charge holding unit 3, a floating diffusion (hereinafter referred to as FD) unit 6, and an overflow drain (OFD) unit. For connection/disconnection switching or signal amplification of all these units, the pixel P1 further includes a first transfer transistor 14, a second transfer transistor 15, a selection transistor 18, a reset transistor 16, an amplification transistor 17, and an OFD transistor 19. These transistors are each configured of a device such as a metal-oxide-semiconductor field-effect transistor (MOSFET). For example, the transistors have a drain terminal, a source terminal, and a gate electrode (a gate terminal) for controlling conduction between the drain terminal and the source terminal. The selection transistor 18 in each of the pixels P1 is connected to an output line 22. Typically, a plurality of pixels included in one column is connected to the one output line 22. A ground voltage is supplied from a ground node 21 to the pixel P1. Further, a power source voltage is supplied from a power supply node 20. The OFD unit is connected to the power supply node 20.

The photoelectric conversion unit 1 generates signal charges according to an incident-light quantity. The charge holding unit 3 is connected to the photoelectric conversion unit 1 via the first transfer transistor 14. The first transfer transistor 14 transfers electric charges of the photoelectric conversion unit 1 to the charge holding unit 3. The charge holding unit 3 is indicated as a ground capacitor or a diode, in the equivalent circuit diagram. The charge holding unit 3 temporarily holds electric charges transferred from the photoelectric conversion unit 1.

The FD unit 6 converts electric charges transferred from the charge holding unit 3 into a voltage signal. The FD unit 6 is connected to the charge holding unit 3 via the second transfer transistor 15. The second transfer transistor 15 transfers electric charges of the charge holding unit 3 to the FD unit 6. The FD unit 6 is also connected to the source terminal of the reset transistor 16 and the gate terminal of the amplification transistor 17. The power source voltage is supplied to the drain terminal of the reset transistor 16. The voltage of the FD unit 6 is reset to the power source voltage by turning on the reset transistor 16.

The amplification transistor 17 outputs a signal according to the voltage of the gate terminal to the output line 22. For example, the amplification transistor 17 outputs a reset signal, in a state where the voltage of the FD unit 6 is reset to the power source voltage. In addition, after the second transfer transistor 15 is turned on, and electric charges are transferred from the charge holding unit 3 to the FD unit 6, a pixel signal corresponding to the amount of the transferred electric charges is output to the source terminal of the amplification transistor 17.

The source terminal of the amplification transistor 17 is connected to the drain terminal of the selection transistor 18. The source terminal of the selection transistor 18 is connected to the output line 22. When the selection transistor 18 is turned on, a reset signal or a pixel signal is output to the output line 22. Thus, the signal is read out from the pixel P1.

The OFD unit is connected to the photoelectric conversion unit 1 via the OFD transistor 19. When the OFD transistor 19 is turned on, electric charges accumulated in the photoelectric conversion unit 1 are output to the OFD unit.

Here, the global electronic shutter operation to be performed by the imaging apparatus of the present exemplary embodiment will be briefly described. Signal charges photoelectrically converted in the photoelectric conversion unit 1 are accumulated in the photoelectric conversion unit 1. After that, the signal charges are transferred to the charge holding unit 3, by turning on the first transfer transistor 14. In an imaging apparatus not provided with the charge holding unit 3, transfer transistors are driven sequentially row by row to read out signal charges in a plurality of rows. In contrast, the imaging apparatus of the present exemplary embodiment includes the charge holding unit 3, and thus can transfer the signal charges of the photoelectric conversion unit 1 for all the rows simultaneously to the charge holding unit 3. At this moment, the photoelectric conversion unit 1 transitions to an empty state, i.e., the initial state and therefore, the next exposure starts. Hence, the global electronic shutter operation for controlling the exposure start and the exposure end can be performed in all the pixels P1 simultaneously. The reading out of signal charges from the charge holding unit 3 to the FD unit 6 is performed by driving the second transfer transistor 15 sequentially row by row. The reading out of a signal in and after the process in the FD unit 6 is similar to a known method and thus will not be described in detail.

The above-described operation suppresses an exposure-timing deviation that occurs due to reading out of electric charges sequentially from each of the pixels P1. This reduces distortion of an image. The global electronic shutter operation may be implemented by outputting electric charges to the OFD unit simultaneously for all the pixels P1 and then transferring the accumulated electric charges to the charge holding unit 3. The global electronic shutter operation is an example of a driving method applicable to the imaging apparatus of the present exemplary embodiment. The imaging apparatus of the present exemplary embodiment may be performed only with the rolling shutter operation.

Figure 3:
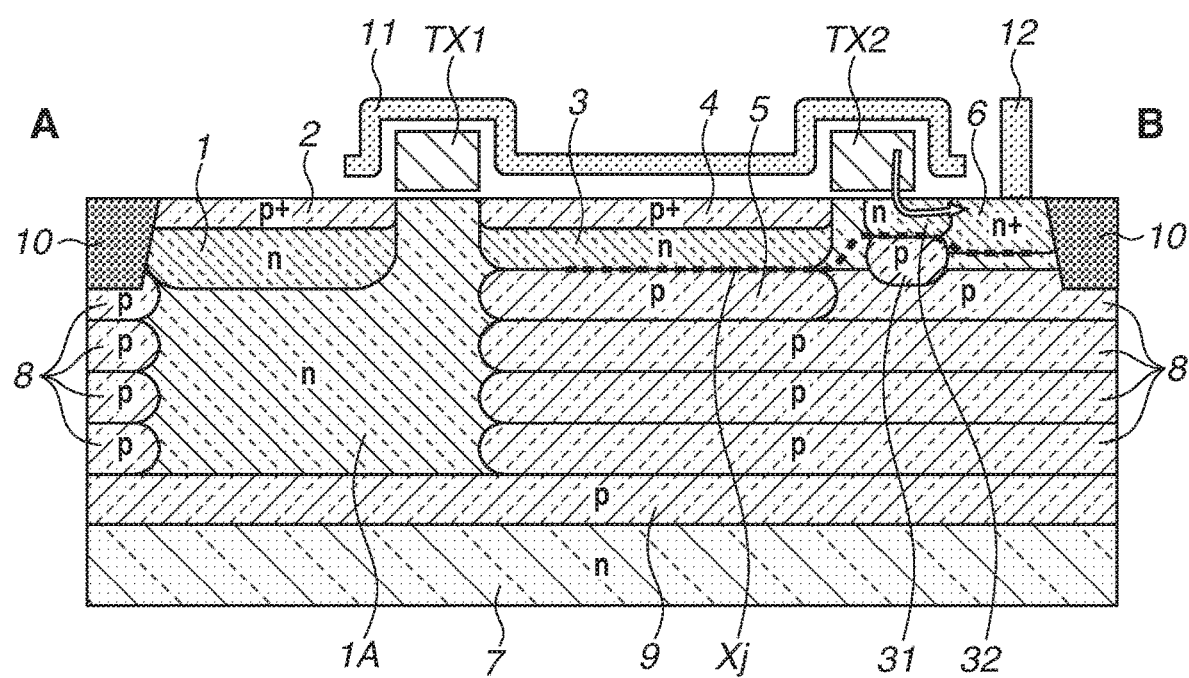
FIG. 3 is a diagram schematically illustrating a sectional structure of a pixel in an imaging apparatus.

FIG. 2 is a diagram schematically illustrating a plane structure of the pixel P1 according to the first exemplary embodiment of the disclosure. FIG. 2 is a plan view of a surface of the semiconductor substrate (hereinafter may also be referred to as the substrate) on which components such as the photoelectric conversion unit are arranged. In the surface of the semiconductor substrate, for example, a semiconductor material such as silicon is in contact with an insulator material. FIG. 3 is a diagram schematically illustrating a section structure along a line from a point A to a point B in FIG. 2. Portions corresponding to those of the circuit in FIG.

1 are provided with the same numerals as those in FIG. 1, and the description of the configurations and functions already described may be omitted. To simplify the figure, only the gate electrode (the gate terminal) of each transistor is provided with a numeral with respect to transistors.

FIG. 2 illustrates a semiconductor region configured with the photoelectric conversion unit 1, the charge holding unit 3, the FD unit 6, and the power supply node 20, and a semiconductor region connected to the output line 22. FIG. 2 further illustrates a first transfer gate electrode TX1 of the first transfer transistor 14, and a second transfer gate electrode TX2 of the second transfer transistor 15 (a selection transistor). FIG. 2 further illustrates a gate electrode RES of the reset transistor 16, a gate electrode SFG of the amplification transistor 17, a gate electrode SEL of the selection transistor 18, and a gate electrode OFD of the OFD transistor 19. Semiconductor regions at both ends of each gate are a source region and a drain region of the corresponding transistor. Each black dot in FIG. 2 indicates a contact with the semiconductor region or the gate electrode. FIG. 2 also illustrates a plane structure of a light shielding layer 11.

Next, a section structure in FIG. 3 will be described. The photoelectric conversion unit 1 is formed of an n-type semiconductor region. Light entering the photoelectric conversion unit 1 is photoelectrically converted into electrons. Here, a surface protection layer 2 of the p-type, which is the opposite conductivity type, is formed on the substrate surface side of the photoelectric conversion unit 1. The photoelectric conversion unit 1 and the surface protection layer 2 form a pn junction. In other words, an embedded diode is configured of the photoelectric conversion unit 1 and the surface protection layer 2. Such a configuration can suppress noise that occurs at the surface of the semiconductor substrate.

A deep portion 1A of the photoelectric conversion unit 1 is an n-type semiconductor region having an impurity concentration lower than that of the photoelectric conversion unit 1. Electrons generated at a deep position of the semiconductor substrate can be collected in the photoelectric conversion unit 1 using the deep portion 1A. The deep portion 1A of the photoelectric conversion unit 1 can be changed to a p-type semiconductor region.

An embedded layer 9 and a base 7 of the semiconductor substrate are provided below the deep portion 1A of the photoelectric conversion unit 1. The embedded layer 9 is a p-type semiconductor region. The base 7 is an n-type semiconductor region. The embedded layer 9 forms a potential barrier to the electric charges of the base 7. Such a configuration can prevent or suppress mixing of the electric charges of the base 7 into the photoelectric conversion unit 1 and the charge holding unit 3.

The charge holding unit 3 will be described. The charge holding unit 3 is formed of an n-type semiconductor region. A surface protection layer 4 of the p-type, which is the opposite conductivity type, is formed on the substrate surface side of the charge holding unit 3. The charge holding unit 3 and the surface protection layer 4 form a pn junction. As with the photoelectric conversion unit 1 described above, an embedded diode is configured with the charge holding unit 3 and the surface protection layer 4. Noise that is generated at the surface of the semiconductor substrate can be suppressed by employing the configuration of the embedded diode for the charge holding unit 3.

A depletion suppression unit 5, which is a p-type semiconductor region, is formed below the charge holding unit 3. The depletion suppression unit 5 has an effect of preventing or suppressing mixing of electric charges present at a portion deeper than the depletion suppression unit 5 into the charge holding unit 3. Further, the charge holding unit 3 and the depletion suppression unit 5 form a pn junction, and constitute a part of a pn-junction portion Xj. The depletion suppression unit 5 transfers electric charges by bringing the charge holding unit 3 into a complete depletion state and thus is effective in reducing a voltage to be applied.

A well 8 is formed in the semiconductor substrate. The well 8 is a p-type semiconductor region. The charge holding unit 3, the surface protection layer 4, and the depletion suppression unit 5 may be formed inside the well 8. The well 8 is formed by implanting plural kinds of impurities of implantation energies different from each other. By making impurity concentration below a portion of the well 8 lower than the impurity concentration of the depletion suppression unit 5, the effect of preventing mixing of unnecessary electric charges into the charge holding unit 3 is increased.

On the semiconductor substrate, the light shielding layer 11 covering at least the charge holding unit 3 is formed. The light shielding layer 11 blocks out light traveling toward the charge holding unit 3 and thereby prevents generation of unnecessary electric charges in the charge holding unit 3. In general, a metal having an effect of blocking out visible light, such as tungsten or aluminum is used for the light shielding layer 11. The material used for the light shielding layer 11 is not limited to the above-described materials. The light shielding layer 11 may cover the first transfer gate electrode TX1 and the second transfer gate electrode TX2 provided on the semiconductor substrate. Further, the light shielding layer 11 may cover a part of the photoelectric conversion unit 1 and a part of the FD unit 6, as illustrated in FIGS. 2 and 3.

An element isolation region 10 is a separation structure using an insulator based on a technique such as shallow trench isolation (STI) or local oxidation of silicon (LOCOS). The element isolation region 10 electrically separates the elements serving as the pixels. Further, the element isolation region 10 defines an active region where the photoelectric conversion unit 1 and the charge holding unit 3 are provided.

The imaging apparatus of the present exemplary embodiment includes the FD unit 6, a punch-through prevention layer 31, and a transfer assistance layer 32. The FD unit 6 is an n-type semiconductor region. Signal charges generated in the photoelectric conversion unit 1 are transferred to the FD unit 6. The FD unit 6 is connected to the gate electrode SFG of the amplification transistor 17. The signal charges are subjected to charge-voltage conversion in the FD unit 6.

The punch-through prevention layer 31 is a p-type semiconductor region. The punch-through prevention layer 31 is disposed between the charge holding unit 3 and the FD unit 6 such that it is in contact with the FD unit 6. Such disposition allows the punch-through prevention layer 31 to prevent or suppress a leakage of electric charges from the charge holding unit 3 into the FD unit 6. As a result, the punch-through prevention layer 31 can reduce a decline in saturation charge quantity. In a case where the impurity concentration of the charge holding unit 3 is raised to increase the saturation charge quantity, an effect of suppressing a leakage of electric charges caused by providing the punch-through prevention layer 31 is more remarkable.

In one embodiment, the punch-through prevention layer 31 has an impurity concentration higher than that of the well 8. This can more effectively reduce a leakage of electric charges. Further, the punch-through prevention layer 31 is disposed at a shallower position than the depletion suppression unit 5. This can more effectively reduce a leakage of electric charges. In the present exemplary embodiment, the punch-through prevention layer 31 is away from the depletion suppression unit 5. This can suppress a decline in electric-charge transfer characteristics. As will be described below, the punch-through prevention layer 31 may be in contact with the depletion suppression unit 5.

The transfer assistance layer 32 is formed on the punch-through prevention layer 31. In other words, the transfer assistance layer 32 is formed between the punch-through prevention layer 31 and the surface of the semiconductor substrate. The transfer assistance layer 32 is an n-type semiconductor region. The transfer assistance layer 32 is formed to reduce a potential barrier caused by forming the punch-through prevention layer 31. This can make it easy to transfer electric charges from the charge holding unit 3 to the FD unit 6. In addition, because the transfer assistance layer 32 is provided, the second transfer transistor 15 can form an embedded channel. By forming the embedded channel, the influence of a defect can be reduced that is exerted on a portion such as a gate oxide film interface below the second transfer gate electrode TX2. As a result, the generation of noise can be suppressed.

When the global electronic shutter operation is performed, the reading out of signal charges from the charge holding unit 3 to the FD unit 6 is carried out sequentially row by row. Therefore, the time for holding the signal charges in the charge holding unit 3 varies for each row. The pixel having a longer holding time may be much more affected by noise, due to the influence of dark current noise generated at a portion such as the substrate surface of the charge holding unit 3 and the transfer channel of electric charges. That is, there is a possibility that the amounts of noise may vary from row to row, due to the dark current. The transfer assistance layer 32 is formed near the surface of the substrate and thus can be a factor responsible for the generation of the dark current. Therefore, to reduce the noise attributable to the dark current generated at the transfer assistance layer 32, the transfer assistance layer 32 may be unevenly distributed on the FD unit 6 side within a region below the second transfer gate electrode TX2. In other words, the charge holding unit 3 and the transfer assistance layer 32 are formed in such a way that they are away from each other. Such a configuration can reduce the probability that the generated dark current enters into the charge holding unit 3. As for the photoelectric conversion unit 1, because the control is performed for all the pixels simultaneously, the influences of noise within a screen do not vary.

Further, an additional effect of the present exemplary embodiment will be described with reference to FIG. 3. As described above, it is not desirable that signal charges of another frame be mixed into the charge holding unit 3 when signal charges are held in the charge holding unit 3. To prevent the entry of light into the charge holding unit 3 during the exposure period of another frame, the above-described light shielding layer 11 is provided. However, the light shielding layer 11 has an opening at a position where a contact with the semiconductor substrate or the gate electrode is formed. Parasitic light PL entering from this opening portion can propagate through the gate electrode etc. and arrive at the neighborhood of the charge holding unit 3. Therefore, as in the configuration of the present exemplary embodiment, the transfer assistance layer 32 is unevenly distributed on the FD unit 6 side within the region below the second transfer gate electrode TX2. This can prevent the arrival of electric charges, which are generated below the second transfer gate electrode TX2 due to the propagated parasitic light PL, at the charge holding unit 3. As a result, the noise can be reduced.

The punch-through prevention layer 31 and the transfer assistance layer 32 form a pn junction, and constitute a part of the pn-junction portion Xj. Further, the FD unit 6 and each of the well 8 and the punch-through prevention layer 31 form a pn junction, and constitute a part of the pn-junction portion Xj. The pn-junction portion Xj including the above-described pn junction of the charge holding unit 3, is formed at a position indicated with a dotted line in FIG. 3. Below the second transfer gate electrode TX2, the pn-junction portion Xj is formed such that it is away from the interface with the gate oxide film (the surface of the semiconductor region). Such a configuration can suppress difficulty in transferring electric charges due to the formation of a potential barrier, and thus can reduce the time required to transfer the electric charges.

Figure 4A:
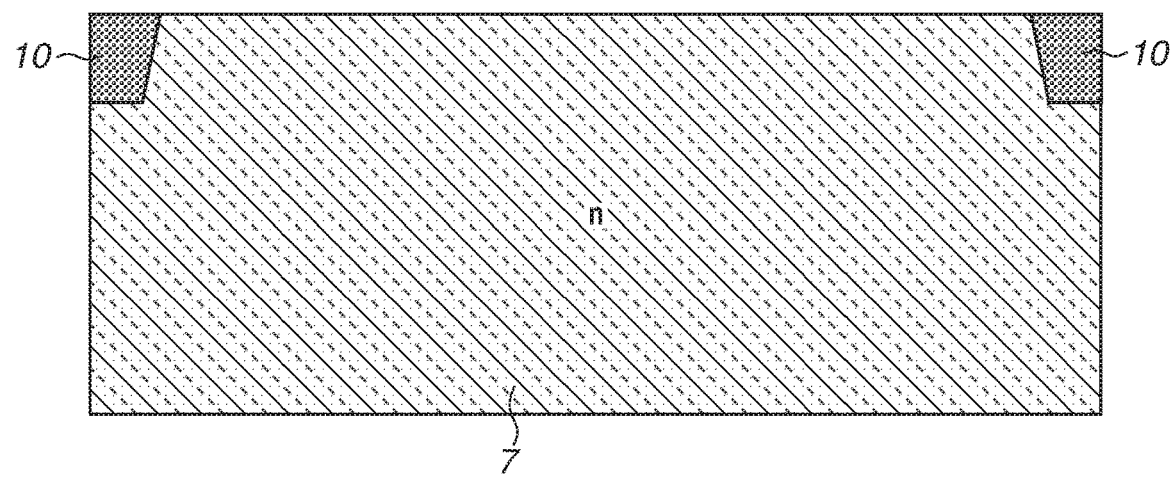
FIGS. 4A, 4B, and 4C are process flow diagrams illustrating a method for forming an imaging apparatus.
Figure 4B:
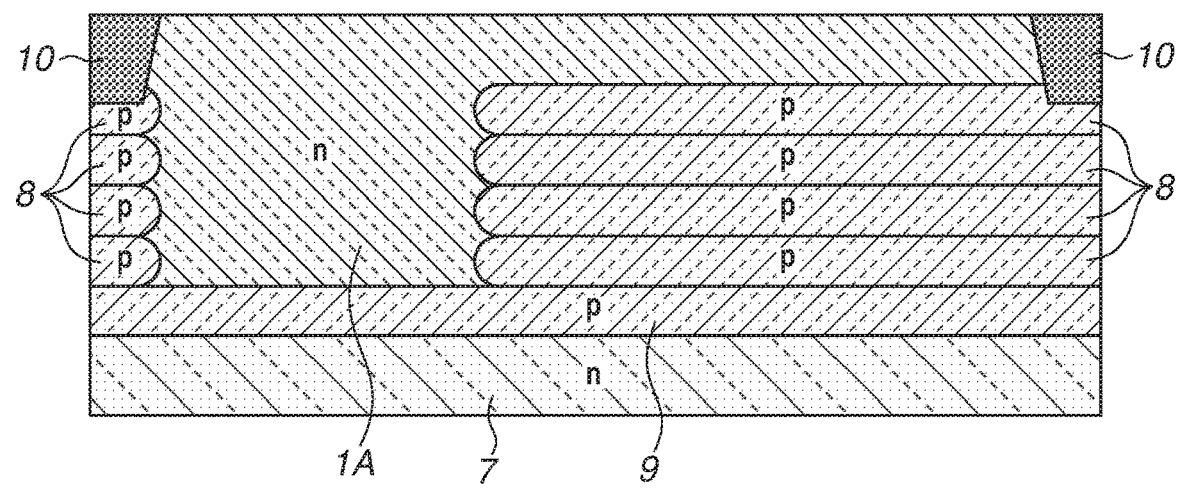

Next, a method for forming the imaging apparatus in the present exemplary embodiment will be described with reference to a process flow diagram in each of FIGS. 4A, 4B, and 4C, as well as FIGS. 5A, 5B, and 5C. First, as illustrated in FIG. 4A, the semiconductor substrate including the base 7 is prepared. The above-described various semiconductor regions are each formed by doping the semiconductor substrate with an impurity. In the end, regions which have not been doped with impurity remain as the base 7. Therefore, in a process performed before the doping with the impurity in FIG. 4A, the entire semiconductor substrate is assumed to be the base 7, for the sake of convenience. In the process illustrated in FIG. 4A, the element isolation region 10 is formed at a desired position by using a photomask etc.

Subsequently, in a process illustrated in FIG. 4B, the embedded layer 9 and the well 8 are formed. The embedded layer 9 and the well 8 are formed by impurity implantation using the photomask etc. An impurity such as boron that becomes an acceptor is used for the formation of these p-type semiconductor regions.

Figure 4C:
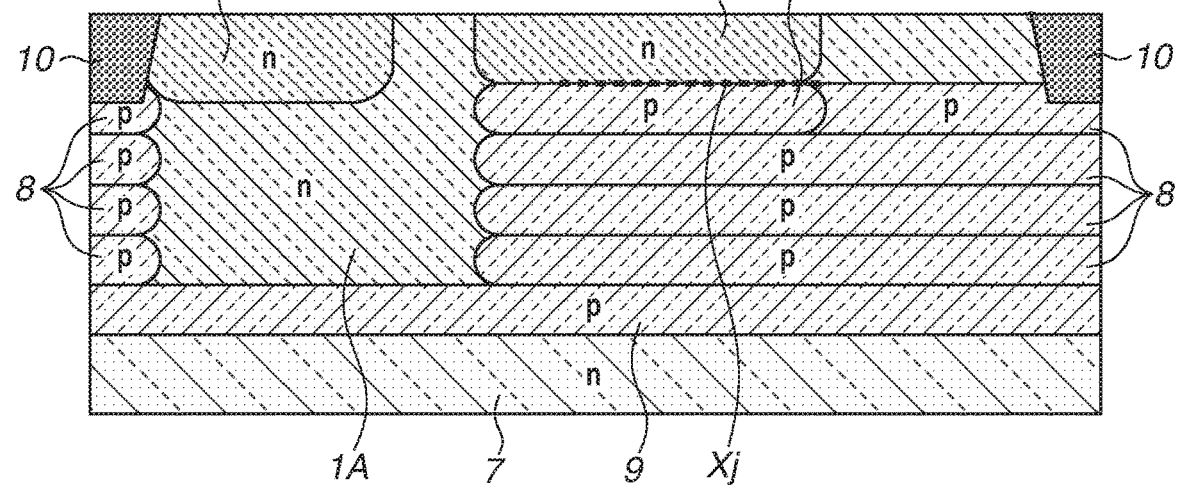

Next, in a process illustrated in FIG. 4C, the photoelectric conversion unit 1, the deep portion 1A of the photoelectric conversion unit 1, the charge holding unit 3, and the depletion suppression unit 5 are formed. These semiconductor regions are formed by impurity implantation using a photomask etc. An impurity that becomes a donor such as arsenic or phosphorus is used for the formation of the n-type semiconductor region. On the other hand, an impurity becomes an acceptor such as boron is used for the formation of the p-type semiconductor region. In the present exemplary embodiment, the charge holding unit 3 and the depletion suppression unit 5 are formed using the same photomask. This method can reduce the possibility of forming a potential barrier due to a misalignment between the charge holding unit 3 and the depletion suppression unit 5. As a result, transfer efficiency can be improved.

Figure 5A:
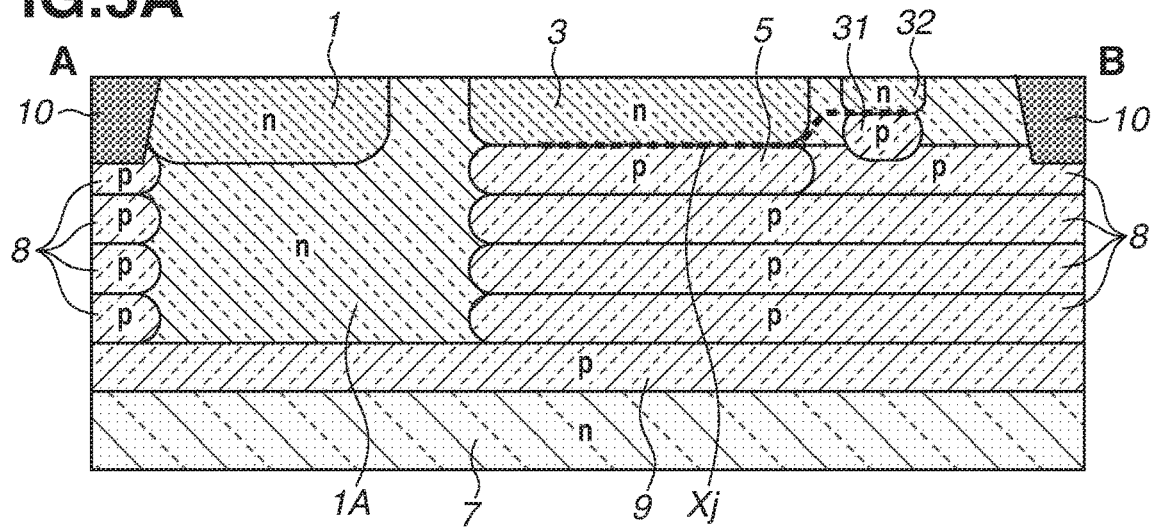
FIGS. 5A, 5B, and 5C are process flow diagrams illustrating a method for forming an imaging apparatus.
Figure 5B:
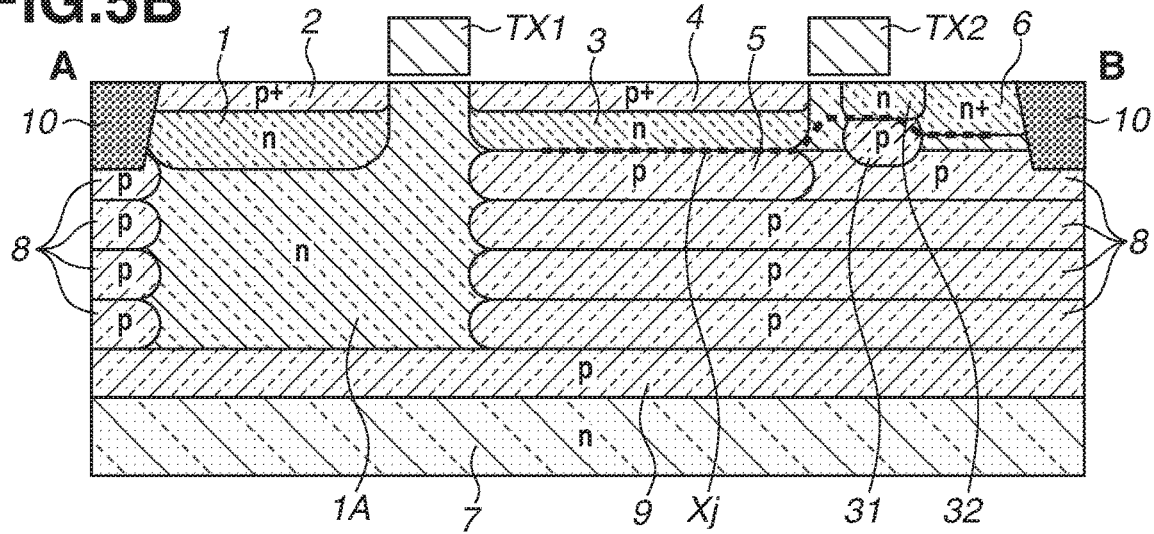
Figure 5C:
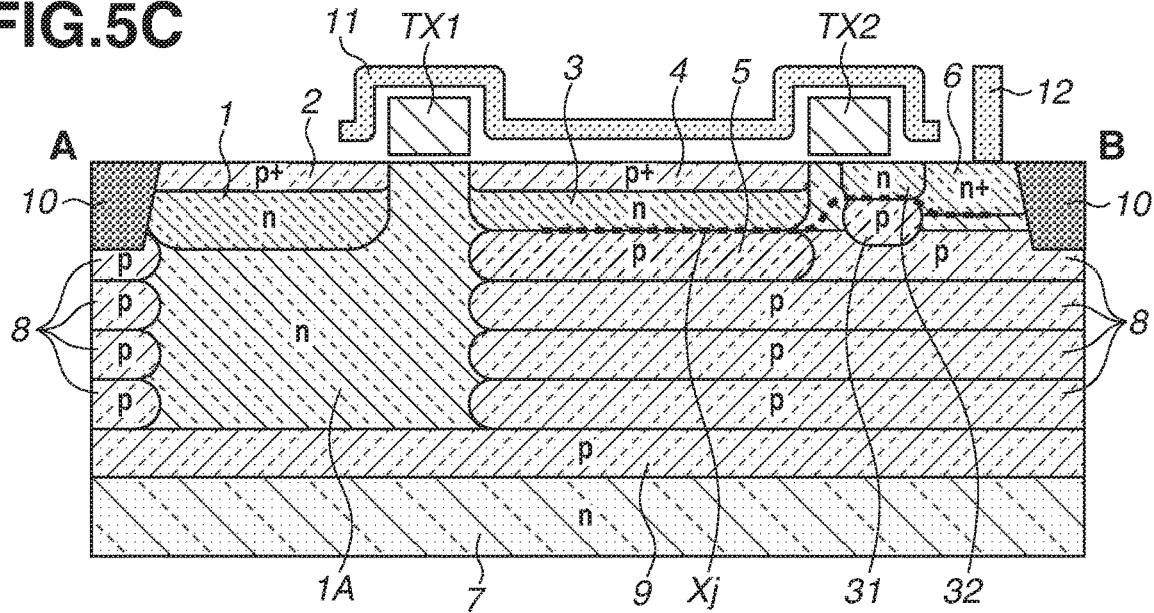

Next, in a process illustrated in FIG. 5A, the punch-through prevention layer 31 and the transfer assistance layer 32 are formed. These regions are formed by impurity implantation using a photomask etc. An impurity that becomes an acceptor such as boron is used for the formation of the punch-through prevention layer 31. An impurity that becomes a donor such as arsenic or phosphorus is used for the formation of the transfer assistance layer 32.

In the present exemplary embodiment, the punch-through prevention layer 31 and the transfer assistance layer 32 are formed using the same photomask. Specifically, the punch-through prevention layer 31 is formed by performing impurity implantation using first implantation energy, and the transfer assistance layer 32 is formed by performing impurity implantation using energy lower than the first implantation energy. This method can suppress a decline in electric-charge transfer characteristics that occurs due to the formation of the punch-through prevention layer 31.

An effect of improving the electric-charge transfer characteristics will be described. When the punch-through prevention layer 31 is formed, a region where a transfer channel is to be formed can be doped with an impurity for forming the p-type semiconductor region. The inventors have found that this impurity causes a potential barrier at the transfer channel or makes it difficult for the potential of the transfer channel to decrease, which is may be an issue. To address such an issue, counter-doping is performed using an impurity for forming a semiconductor region of the opposite conductivity type. The transfer characteristics can be thereby maintained. The punch-through prevention layer 31 and the transfer assistance layer 32 are formed using the same mask. Therefore, a region including an unintentionally implanted impurity can be accurately countered-doped. Hence, it is possible to improve the transfer characteristics, while suppressing deterioration in the function of the punch-through prevention.

In the present exemplary embodiment, the transfer assistance layer 32 is formed in an n-type semiconductor region, as illustrated in FIG. 3. Therefore, in the process illustrated in FIG. 5A of the manufacturing method in the present exemplary embodiment, doping is performed using an impurity of a dose sufficient for the formation of the n-type semiconductor region. However, even if the n-type semiconductor region is not formed, an effect of improving the transfer characteristics can be obtained by only performing the above-described counter-doping. In other words, the transfer assistance layer 32 may be formed in a p-type semiconductor region, if the counter-doping is performed.

A positional relationship between the mask used in the process for forming the charge holding unit 3 and the mask used in the process for forming the punch-through prevention layer 31 and the transfer assistance layer 32 will be described with reference to FIG. 10. FIG. 10 illustrates a section structure illustrated in FIG. 4C and a section structure illustrated in FIG. 5A, in an upper part and a lower part, respectively.

FIG. 10 illustrates a mask 50 used in the process for forming the charge holding unit 3, and a mask 51 used in the process for forming the punch-through prevention layer 31 and the transfer assistance layer 32. Each of the masks 50 and 51 has an opening. Through the opening, the impurity is implanted into the semiconductor substrate. The opening of the mask 50 and the opening of the mask 51 are away from each other by a distance d. Noise can be reduced by using the mask 50 and the mask 51 having the positional relationship illustrated in FIG. 10.

As described above, the transfer assistance layer 32 is formed near the surface of the substrate and thus can become a factor responsible for the generation of the dark current. Therefore, the transfer assistance layer 32 is to be unevenly distributed on the FD unit 6 side within the region below the second transfer gate electrode TX2. The transfer assistance layer 32 unevenly distributed can be formed using the two masks 50 and 51 illustrated in FIG. 10.

Even if the opening of the mask 50 and the opening of the mask 51 are away from each other, there is a case where an n-shaped semiconductor region continues from the charge holding unit 3 to the transfer assistance layer 32. This is because the region in which the impurity is implanted is not precisely aligned with the opening of the mask, and the impurity scatters in an annealing process. However, because the openings of the respective two masks and 51 are away from each other, the degree of conduction between the charge holding unit 3 and the transfer assistance layer 32 is lowered. Therefore, a sufficient effect of reducing noise can be obtained.

The next process will be described. In the process illustrated in FIG. 5B, the first transfer gate electrode TX1, the second transfer gate electrode TX2, the surface protection layer 2 of the photoelectric conversion unit 1, the surface protection layer 4 of the charge holding unit 3, and the FD unit 6 are formed. Subsequently, in the process illustrated in FIG. 5C, the light shielding layer 11 and a contact 12 are formed. Afterward, portions such as a wiring structure, a color filter, a microlens, and a waveguide are appropriately formed.

According to the configuration of the imaging apparatus and the formation method described in the present exemplary embodiment, the improvement of the transfer characteristics and the suppression of the punch-through can be compatible. As a result, an imaging apparatus with high image quality can be formed.

A second exemplary embodiment will be described below. An imaging apparatus of the present exemplary embodiment is different from the first exemplary embodiment, in that a punch-through prevention layer 31 and a transfer assistance layer 32 are disposed in contact with a charge holding unit 3. The point different from the first exemplary embodiment will be mainly described below. Portions similar to those of the first exemplary embodiment will not be described.

In the present exemplary embodiment, a circuit arrangement and a plane structure of an element excluding the punch-through prevention layer 31 and the transfer assistance layer 32 are similar to those in the first exemplary embodiment. In other words, FIGS. 1 and 2 schematically illustrate a circuit arrangement of a pixel according to the present exemplary embodiment and a plane structure of the pixel according to the present exemplary embodiment, respectively.

Figure 6:
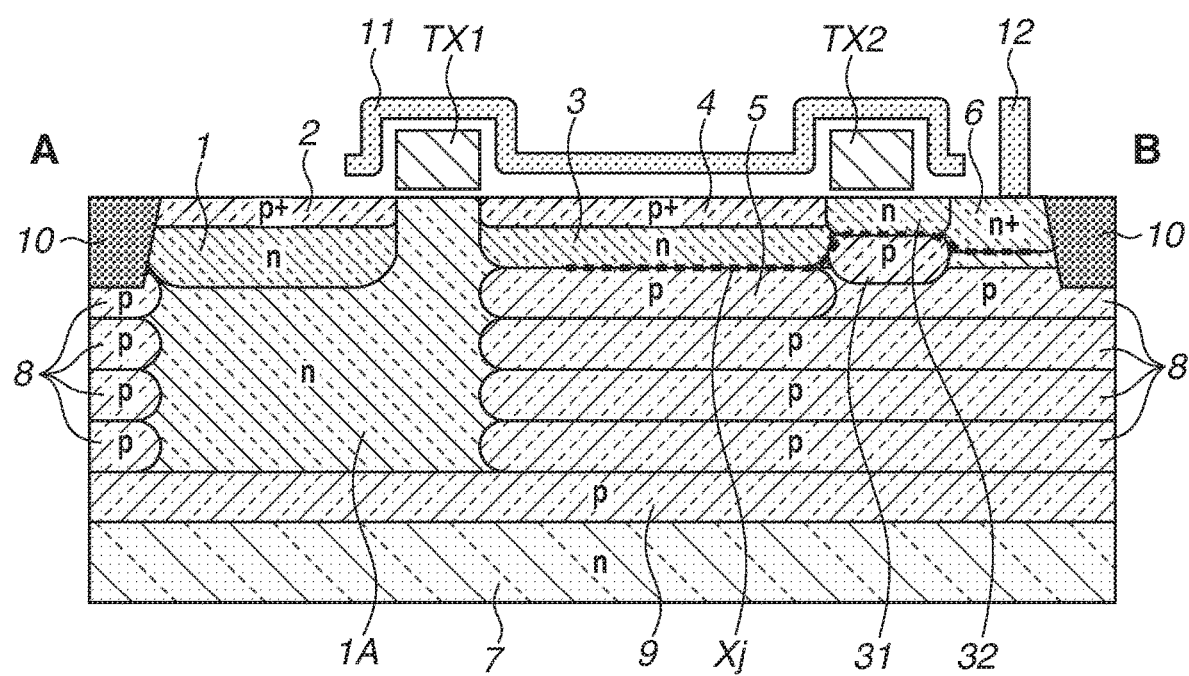
FIG. 6 is a diagram schematically illustrating a sectional structure of a pixel in an imaging apparatus.

FIG. 6 is a diagram schematically illustrating a section structure along a line from a point A to a point B in FIG. 2. Components similar to those illustrated in FIG. 1 to FIG. 5 are provided with the same numerals as those in FIG. 1 to FIG. 5.

As illustrated in FIG. 6, the punch-through prevention layer 31 and the transfer assistance layer 32 are disposed to contact the charge holding unit 3. According to such a configuration, electric charges can be efficiently transferred. When an on-voltage is applied to a second transfer gate electrode TX2 to perform the transfer of electric charges from the charge holding unit 3 to a FD unit 6, a potential can be reduced in most of a region below the second transfer gate electrode TX2. As a result, the transfer can be easily performed. In other words, because the transfer can be easily performed, the on-voltage to be applied to the second transfer gate electrode TX2 can be reduced in comparison with a case where the punch-through prevention layer 31 and the transfer assistance layer 32 are not extended. As a result, power consumption can be reduced.

A third exemplary embodiment will be described below. An imaging apparatus of the present exemplary embodiment is different from the first and second exemplary embodiments, in that a second punch-through prevention layer 33 and a second transfer assistance layer 34 are provided below a first transfer gate electrode TX1. The point different from the first and second exemplary embodiments will be mainly described below. A portion similar to the first or second exemplary embodiment will not be described.

In the present exemplary embodiment, a circuit arrangement and a plane structure of an element excluding the second punch-through prevention layer 33 and the second transfer assistance layer 34 are similar to the first exemplary embodiment. In other words, FIGS. 1 and 2 schematically illustrate a circuit arrangement of a pixel according to the present exemplary embodiment and a plane structure of the pixel according to the present exemplary embodiment, respectively.

Figure 7:
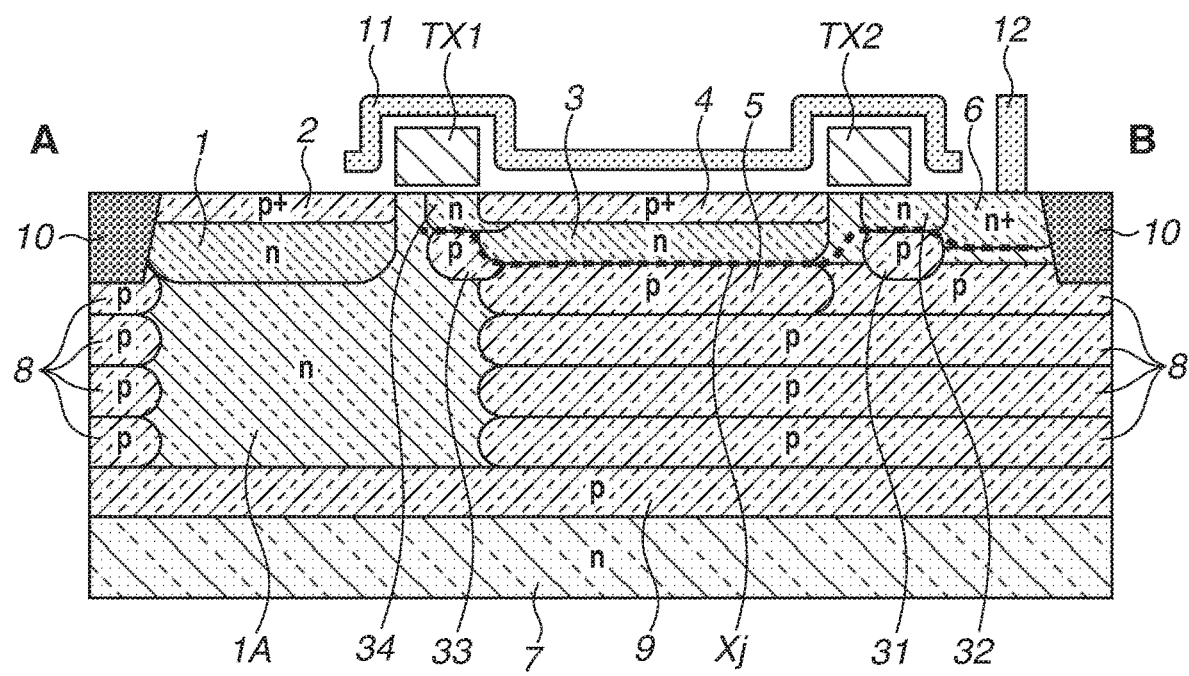
FIG. 7 is a diagram schematically illustrating a sectional structure of a pixel in an imaging apparatus.

FIG. 7 is a diagram schematically illustrating a section structure along a line from a point A to a point B in FIG. 2. Components similar to those illustrated in FIG. 1 to FIG. 5 are provided with the same numerals as those in FIG. 1 to FIG. 5.

The second punch-through prevention layer 33 and the second transfer assistance layer 34 are formed below the first transfer gate electrode TX1. The second punch-through prevention layer 33 is a p-type semiconductor region. The second punch-through prevention layer 33 is disposed between a photoelectric conversion unit 1 and a charge holding unit 3, contacting the charge holding unit 3. Such a placement allows the second punch-through prevention layer 33 to prevent or suppress a leakage of electric charges from the photoelectric conversion unit 1 to the charge holding unit 3.

The second transfer assistance layer 34 is formed on the second punch-through prevention layer 33. In other words, the second transfer assistance layer 34 is formed between the second punch-through prevention layer 33 and the surface of the semiconductor region. The second transfer assistance layer 34 is an n-type semiconductor region. The second transfer assistance layer 34 is formed to reduce a potential barrier caused by forming the second punch-through prevention layer 33. As a result, electric charges can be easily transferred from the photoelectric conversion unit 1 to the charge holding unit 3. In addition, in comparison with a case where the second transfer assistance layer 34 is not present, it is possible to reduce the on-voltage to be applied to the first transfer gate electrode TX1 to turn on a first transfer transistor 14. As a result, power consumption can be reduced.

A method for manufacturing the imaging apparatus of the present exemplary embodiment will be described. In a process illustrated in FIG. 5A, a punch-through prevention layer 31 and the second punch-through prevention layer 33 may be simultaneously formed. An opening corresponding to a region between the photoelectric conversion unit 1 and the charge holding unit 3 is provided in a mask 51 illustrated in FIG. 10. The punch-through prevention layer 31 and the second punch-through prevention layer 33 can be simultaneously formed by performing impurity implantation using the mask 51 having two openings.

The second transfer assistance layer 34 is formed by impurity implantation using the same mask as the mask used to form the second punch-through prevention layer 33. This can prevent the occurrence of a misalignment between the second punch-through prevention layer 33 and the second transfer assistance layer 34. Further, a transfer assistance layer 32 and the second transfer assistance layer 34 may be simultaneously formed.

The formation method is not limited to the above-described example, and can be appropriately modified within the scope of applications of the present exemplary embodiment.

The second punch-through prevention layer 33 and the second transfer assistance layer 34 form a pn junction. The pn junction formed by these layers forms a part of a pn-junction portion Xj. As illustrated in FIG. 7, in a region below the first transfer gate electrode TX1, the pn-junction portion Xj is formed away from an interface of a gate oxide film (the surface of the semiconductor region). Such a configuration can suppress difficulty in transferring electric charges due to the formation of a potential barrier, and thus can reduce the time required to transfer the electric charges.

Improvement of transfer efficiency and suppression of punch-through can go together by adopting the configuration and the formation method described in the present exemplary embodiment, for both of the first transfer transistor 14 and a second transfer transistor 15.

A fourth exemplary embodiment will be described below. An imaging apparatus of the present exemplary embodiment is different from the first to third exemplary embodiments, in that the length (the gate length) of a second transfer gate electrode TX2 is shorter than the length (the gate length) of a first transfer gate electrode TX1 in an electric-charge transfer direction. The point different from the first to third exemplary embodiments will be mainly described below. A portion similar to that of any of the first to third exemplary embodiments will not be described.

In the present exemplary embodiment, a circuit arrangement and a plane structure of an element excluding the first transfer gate electrode TX1 and the second transfer gate electrode TX2 are similar to those in the first exemplary embodiment. In other words, FIGS. 1 and 2 schematically illustrate a circuit arrangement of a pixel according to the present exemplary embodiment and a plane structure of the pixel according to the present exemplary embodiment, respectively.

Figure 8:
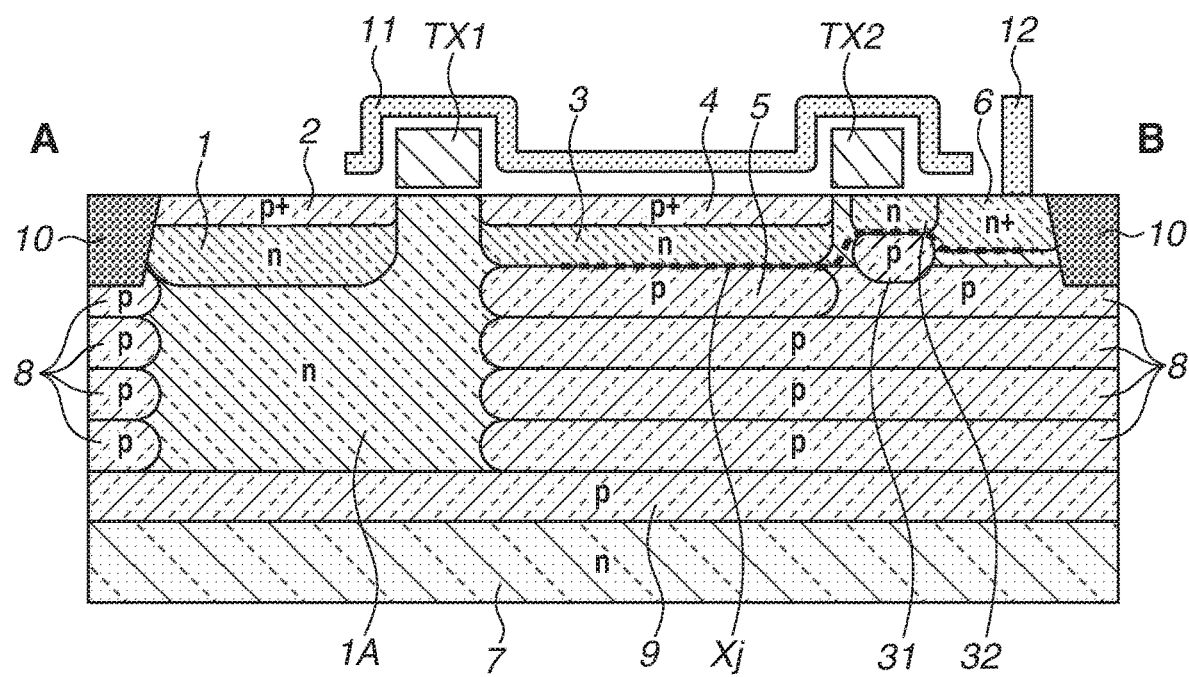
FIG. 8 is a diagram schematically illustrating a sectional structure of a pixel in an imaging apparatus.

FIG. 8 is a diagram schematically illustrating a section structure along a line from a point A to a point B in FIG. 2. Components similar to those illustrated in FIG. 1 to FIG. 5 are provided with the same numerals as those in FIG. 1 to FIG. 5.

As illustrated in FIG. 8, the gate length of the second transfer gate electrode TX2 is shorter than the first transfer gate electrode TX1. The gate length is, typically, a length in a direction parallel to the cross-sectional surface of the semiconductor substrate in a section along the electric-charge transfer direction. Assume that the plane shape of the transfer gate electrode has a first side and a second side parallel to each other, the first side is on the side where a photoelectric conversion unit 1 is provided, and the second side is on the side where a charge holding unit 3 is provided, as illustrated in FIG. 2. In this case, the distance between these two sides may be taken as the gate length.

The configuration of the present exemplary embodiment can reduce the time required to transfer electric charges from the charge holding unit 3 to a FD unit 6. Because the gate length of the second transfer gate electrode TX2 is shorter, the electric charges of the charge holding unit 3 are immediately transferred to the FD unit 6 having a lower potential. A second transfer transistor 15 including the second transfer gate electrode TX2 is driven sequentially row by row. In other words, electric charges are transferred from the charge holding unit 3 to the FD unit 6 sequentially row by row. Therefore, the time required to read a signal of one frame can be greatly shortened by reducing the time required for the transfer of electric charges by the second transfer transistor 15. As a result, a frame rate can be improved.

A fifth exemplary embodiment will be described below. An imaging apparatus of the present exemplary embodiment has a plane structure different from the imaging apparatus of each of the first to fourth exemplary embodiments. The point different from the first to fourth exemplary embodiments will be mainly described below. A portion similar to that of any of the first to fourth exemplary embodiments will not be described.

Figure 9:
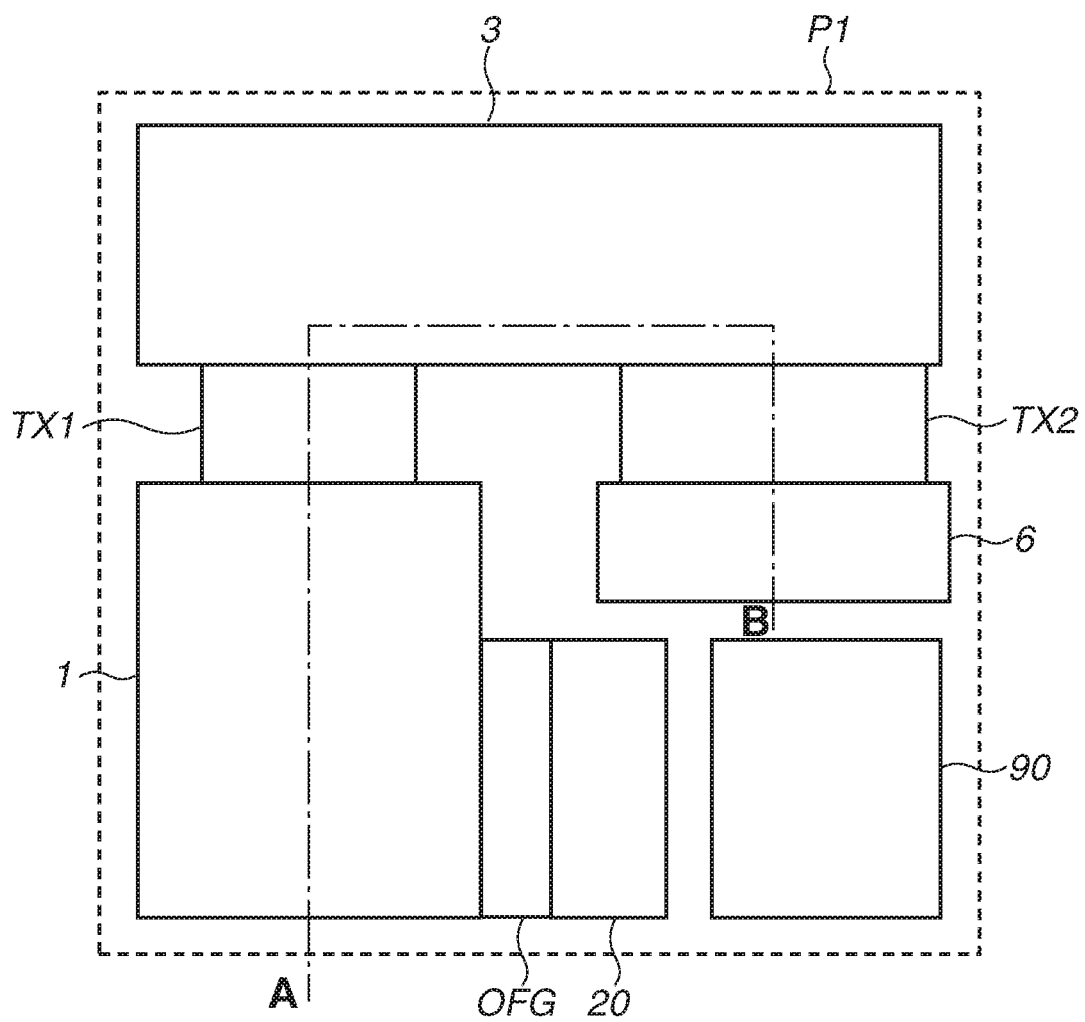
FIG. 9 is a diagram schematically illustrating a plane structure of a pixel in an imaging apparatus.

FIG. 9 is a diagram schematically illustrating a plane structure of a pixel P1 according to the present exemplary embodiment. Components similar to those illustrated in FIG. 1 to FIG. 8 are provided with the same numerals as those in FIG. 1 to FIG. 8.

A photoelectric conversion unit 1 and a charge holding unit 3 are disposed to face each other. A first transfer gate electrode TX1 of a first transfer transistor is formed between the photoelectric conversion unit 1 and the charge holding unit 3. An OFD unit (a power supply node 20) is disposed to face the photoelectric conversion unit 1. The gate electrode OFG of an OFD transistor 19 is formed between the photoelectric conversion unit 1 and the OFD unit. A FD unit 6 is disposed on the same side as the side where the photoelectric conversion unit 1 is provided, relative to the charge holding unit 3. A second transfer gate electrode TX2 of a second transfer transistor 15 is formed between the charge holding unit 3 and the FD unit 6. In each of the transfer gate electrodes TX1 and TX2, a length in a direction parallel to the transfer direction is taken as a gate length, and a length in a direction perpendicular to the transfer direction is taken as a gate width. Transistors such as a reset transistor 16, an amplification transistor 17, and a selection transistor 18 are disposed in a pixel transistor region 90.

The photoelectric conversion unit 1 and the FD unit 6 are provided on one side of the charge holding unit 3. Therefore, the transfer direction in the first transfer gate electrode TX1 and the transfer direction in the second transfer gate electrode TX2 are opposite directions. Further, a transfer channel below the first transfer gate electrode TX1 and a transfer channel below the second transfer gate electrode TX2 are formed in parallel. Such a plane structure can increase the area of the charge holding unit 3. As a result, the saturation charge quantity of the pixel P1 can be improved.

The structure of each of the first to fourth exemplary embodiments is applicable to the section structure of the pixel P1 of the present exemplary embodiment. In other words, the sectional structure along a dotted line from a point A to a point B in FIG. 9 is illustrated in each of FIGS. 3, 6, 7, and 8.

FIG. 11 is a diagram illustrating a configuration of an imaging system according to a sixth exemplary embodiment of the disclosure. An imaging system 800 includes an optical unit 810, an imaging apparatus 820, a video signal processing unit 830, a recording communication unit 840, a timing control unit 850, a system control unit 860, and a reproduction display unit 870. The imaging apparatus described in each of the first to fifth exemplary embodiments is used for the imaging apparatus 820.

The optical unit 810 is an optical system including components such as a lens. The optical unit 810 focuses light from an object on a pixel array of the imaging apparatus 820. A plurality of pixels is two-dimensionally arranged in the pixel array. An image of the object is thereby formed. The imaging apparatus 820 outputs a signal according to the light focused on the pixel, at the timing based on a signal from the timing control unit 850. The signal output from the imaging apparatus 820 is input into the video signal processing unit 830. The video signal processing unit 830 performs processing on the input signal, according to a method determined by a program. A signal obtained by the processing in the video signal processing unit 830 is transmitted to the recording communication unit 840, as image data. The recording communication unit 840 transmits a signal for forming an image to the reproduction display unit 870. The reproduction display unit 870 reproduces a moving image or a still image and displays the reproduced image. Further, upon receiving a signal from the video signal processing unit 830, the recording communication unit 840 communicates with the system control unit 860, and performs operation for recording a signal for forming an image into a recording medium (not illustrated).

The system control unit 860 comprehensively controls the operation of the imaging system 800. Specifically, the system control unit 860 controls the driving of the optical unit 810, the timing control unit 850, the recording communication unit 840, and the reproduction display unit 870. Further, the system control unit 860 includes a storage device (not illustrated) serving as a recording medium. The storage device records, for example, a program for the operation of controlling the imaging system 800. Furthermore, the system control unit 860 supplies into the imaging system 800, for example, a signal for switching a driving mode according to an operation performed by a user. Specifically, the signal for switching is supplied, for example, to change a row for readout or a row to be reset, to change a field angle according to electronic zooming, or to cause a field-angle displacement according to an electronic image stabilizing function. The timing control unit 850 controls the timing for driving the imaging apparatus 820 and the video signal processing unit 830 based on the control by the system control unit 860.

An effect similar to each of the first to fifth exemplary embodiments can be obtained in the imaging system 800, by mounting the imaging apparatus 820 according to each of the first to sixth exemplary embodiments.

Figure 12A:
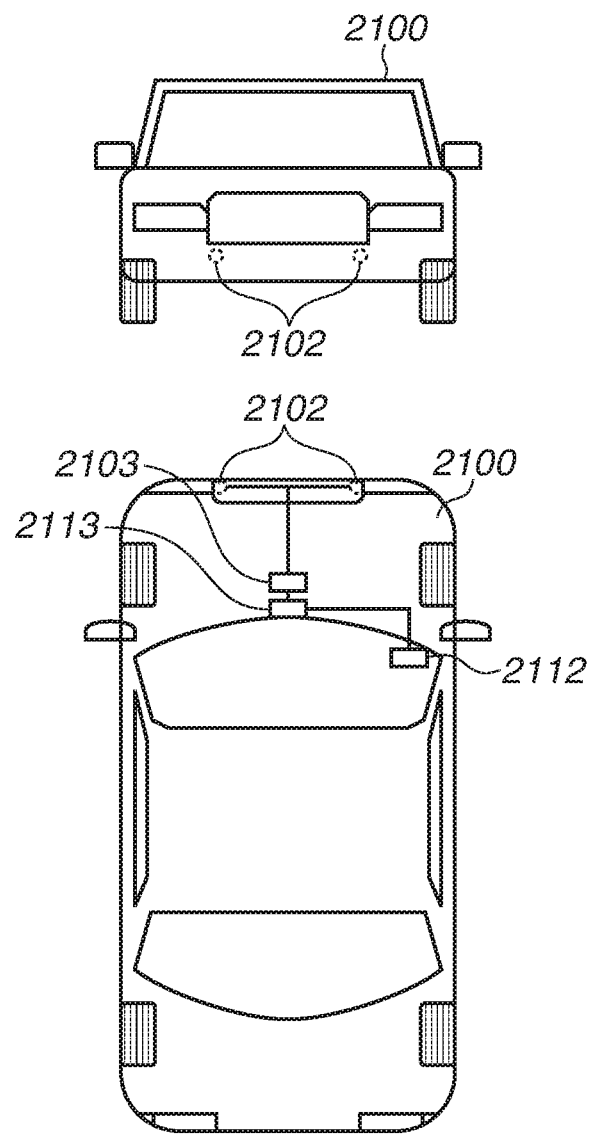
FIGS. 12A and 12B are block diagrams of a moving object.

A moving object according to a seventh exemplary embodiment of the disclosure will be described below. The moving object of the present exemplary embodiment is an automobile with an on-vehicle camera. FIG. 12A schematically illustrates an appearance and a main internal structure of an automobile 2100. The automobile 2100 includes an imaging apparatus 2102, an imaging system integrated circuit (an application specific integrated circuit (ASIC)) 2103, an alarm device 2112, and a main control unit 2113.

The imaging apparatus described in each of the above-described exemplary embodiments is used for the imaging apparatus 2102. When receiving a signal indicating an abnormality from any of devices such as an imaging system, a vehicle sensor, and a control unit, the alarm device 2112 gives a warning to a driver. The main control unit 2113 comprehensively controls the operation of devices such as the imaging system, the vehicle sensor, and the control unit. The automobile 2100 may not include the main control unit 2113. In this case, the imaging system, the vehicle sensor, and the control unit each have a communication interface, and individually perform transmission and receipt of control signals through a communication network (e.g., a Controller Area Network (CAN) standard).

Figure 12B:
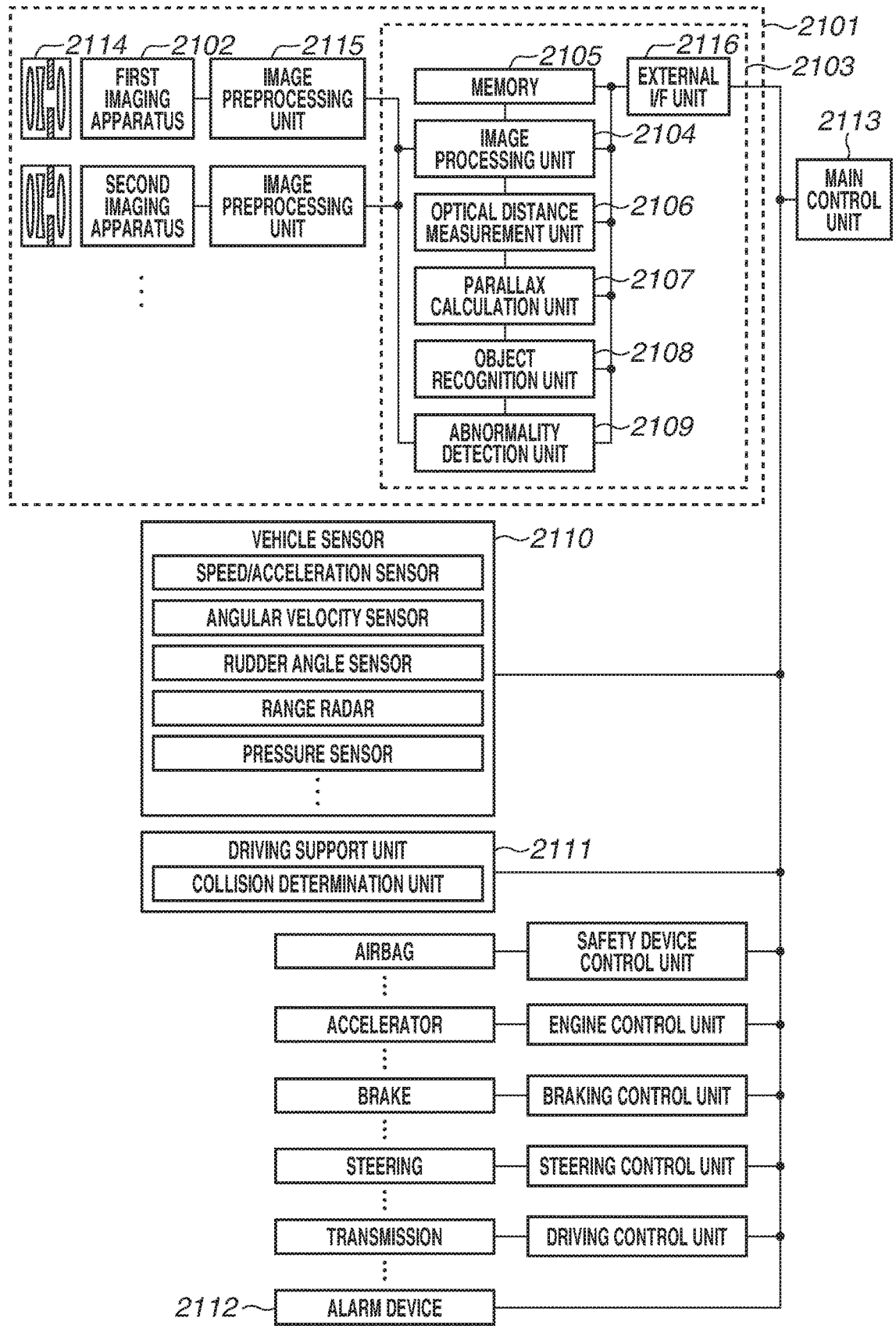

FIG. 12B is a block diagram illustrating a system configuration of the automobile 2100. The automobile 2100 includes a first imaging apparatus 2102 and a second imaging apparatus 2102 each serving as the imaging apparatus 2102. In other words, the on-vehicle camera of the present exemplary embodiment is a stereo camera. An optical unit 2114 forms an object image on the imaging apparatus 2102. An image preprocessing unit 2115 processes a pixel signal output from the imaging apparatus 2102. The processed signal is transmitted to the imaging system integrated circuit 2103. The image preprocessing unit 2115 performs processing such as S-N calculation and synchronization signal addition.

The imaging system integrated circuit 2103 includes an image processing unit 2104, a memory 2105, an optical distance measurement unit 2106, a parallax calculation unit 2107, an object recognition unit 2108, an abnormality detection unit 2109, and an external interface (I/F) unit 2116. The image processing unit 2104 processes a pixel signal, and thereby generates an image signal. Further, the image processing unit 2104 performs correction of an image signal and interpolation of an abnormal pixel. The memory 2105 temporarily holds an image signal. The memory 2105 may store the position of a known abnormal pixel of the imaging apparatus 2102 beforehand. The optical distance measurement unit 2106 performs focusing or distance measurement of an object by using an image signal. The parallax calculation unit 2107 performs object matching (stereo matching) of a parallax image. The object recognition unit 2108 analyzes an image signal, thereby recognizing an object such as an automobile, a person, a traffic sign, or a road. The abnormality detection unit 2109 detects a failure or malfunction of the imaging apparatus 2102. When detecting a failure or malfunction, the abnormality detection unit 2109 transmits a signal indicating the detection of an abnormality to the main control unit 2113. The external I/F unit 2116 mediates information exchange between each unit of the imaging system integrated circuit 2103 and the main control unit 2113 or a device such as various control units.

The automobile 2100 includes a vehicle information acquisition unit 2110 and a driving support unit 2111. The vehicle information acquisition unit 2110 includes vehicle sensors such as a speed/acceleration sensor, an angular velocity sensor, a rudder angle sensor, a range radar, and a pressure sensor.

The driving support unit 2111 includes a collision determination unit. The collision determination unit determines whether there is a possibility of collision with an object, based on information from the optical distance measurement unit 2106, the parallax calculation unit 2107, and the object recognition unit 2108. The optical distance measurement unit 2106 and the parallax calculation unit 2107 are an example of a distance information acquisition unit that acquires information indicating a distance to a target object. In other words, the distance information is information such as a parallax, a de-focusing amount, and a distance to a target object. The collision determination unit may determine the possibility of collision, by using any of these pieces of distance information. The distance information acquisition unit may be implemented by a specifically designed piece of hardware or may be implemented by a software module.

The example in which the driving support unit 2111 controls the automobile 2100 not to collide with other object has been described. However, the above-described configuration is applicable to control for automatic driving to follow other vehicle, and control for automatic driving not to deviate from a traffic lane.

The automobile 2100 further includes drive units used in travel motion, such as airbag, accelerator, brake, steering, and transmission. In addition, the automobile 2100 includes a control unit for these drive units. Based on a control signal of the main control unit 2113, the control unit controls the corresponding drive unit.

The imaging system used in the present exemplary embodiment is applicable not only to an automobile, but also to a moving object (a moving apparatus) such as a ship, an airplane, or an industrial robot. In addition, the imaging system is applicable not only to a moving object, but also to an apparatus for using object recognition widely, such as an intelligent transport system (ITS).

As described above, in the exemplary embodiment using the automobile, the imaging apparatus according to any of the first to fifth exemplary embodiments is used for the imaging apparatus 2102. According to such a configuration, an effect similar to each of the first to fifth exemplary embodiments can be obtained.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-120765, filed Jun. 20, 2017, which is hereby incorporated by reference herein in its entirety.

What is claimed is:

1. An imaging apparatus comprising:
a photoelectric conversion unit of a first conductivity type;
a charge holding unit of the first conductivity type, the charge holding unit being configured to hold electric charges transferred from the photoelectric conversion unit;
a floating diffusion unit of the first conductivity type, the floating diffusion unit being configured to receive electric charges transferred from the charge holding unit;
a punch-through prevention layer of a second conductivity type, the punch-through prevention layer being disposed between the charge holding unit and the floating diffusion unit to contact the floating diffusion unit; and
a transfer assistance layer of the first conductivity type, the transfer assistance layer being disposed between the punch-through prevention layer and a surface of a semiconductor substrate.

2. The imaging apparatus according to claim 1, wherein the punch-through prevention layer and the transfer assistance layer are formed by impurity implantation using a same mask.

3. The imaging apparatus according to claim 1, further comprising a depletion suppression unit of the second conductivity type, the depletion suppression unit being provided below the charge holding unit,
wherein the punch-through prevention layer is provided closer to the surface of the semiconductor substrate than the depletion suppression unit.

4. The imaging apparatus according to claim 1, wherein a semiconductor region of the first conductivity type continues from the charge holding unit to the transfer assistance layer.

5. The imaging apparatus according to claim 1, wherein a pn junction formed by the punch-through prevention layer and the transfer assistance layer is away from the surface of the semiconductor substrate.

6. An imaging apparatus comprising:
a photoelectric conversion unit of a first conductivity type;
a charge holding unit of the first conductivity type, the charge holding unit being configured to hold electric charges transferred from the photoelectric conversion unit;
a floating diffusion unit of the first conductivity type, the floating diffusion unit being configured to receive electric charges transferred from the charge holding unit;

a punch-through prevention layer of a second conductivity type, the punch-through prevention layer being disposed between the charge holding unit and the floating diffusion unit to contact the floating diffusion unit; and a transfer assistance layer of the second conductivity type, the transfer assistance layer being disposed between the punch-through prevention layer and a surface of a semiconductor substrate, wherein an impurity concentration of the transfer assistance layer is lower than an impurity concentration of the punch-through prevention layer.

7. The imaging apparatus according to claim 6, wherein the punch-through prevention layer and the transfer assistance layer are formed by impurity implantation using a same mask.

8. The imaging apparatus according to claim 6, further comprising a depletion suppression unit of the second conductivity type, the depletion suppression unit being provided below the charge holding unit, wherein the punch-through prevention layer is provided closer to the surface of the semiconductor substrate than the depletion suppression unit.

9. The imaging apparatus according to claim 6, wherein a semiconductor region of the first conductivity type continues from the charge holding unit to the transfer assistance layer.

10. The imaging apparatus according to claim 6, wherein a pn junction formed by the punch-through prevention layer and the transfer assistance layer is away from the surface of the semiconductor substrate.

\* \* \* \* \*